US008769158B2

(12) United States Patent
Kretschmann et al.

(10) Patent No.: US 8,769,158 B2
(45) Date of Patent: Jul. 1, 2014

(54) HIGH AVAILABILITY DEVICE LEVEL RING BACKPLANE

(75) Inventors: Robert J. Kretschmann, Bay Village, OH (US); David S. Wehrle, Chesterland, OH (US); Gerald R. Creech, Danbury (GB)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 27 days.

(21) Appl. No.: 13/542,861

(22) Filed: Jul. 6, 2012

(65) Prior Publication Data

US 2013/0010588 A1 Jan. 10, 2013

Related U.S. Application Data

(60) Provisional application No. 61/505,888, filed on Jul. 8, 2011, provisional application No. 61/505,892, filed on Jul. 8, 2011.

(51) Int. Cl.
*H04L 12/54* (2013.01)
*G06F 13/00* (2006.01)
*G06F 13/40* (2006.01)

(52) U.S. Cl.
CPC ................ *H04L 12/56* (2013.01); *G06F 13/00* (2013.01); *G06F 13/409* (2013.01)
USPC .................. 710/8; 710/8; 370/419; 370/401; 370/222; 709/238

(58) Field of Classification Search
CPC ....................................................... G06F 13/00
USPC ................ 710/301, 8; 370/419, 401; 709/238
See application file for complete search history.

(56) References Cited

U.S. PATENT DOCUMENTS

| | | | |
|---|---|---|---|
| 5,472,347 | A | 12/1995 | Nordenstrom et al. |
| 6,662,247 | B1 | 12/2003 | Ales et al. |

FOREIGN PATENT DOCUMENTS

| | | |
|---|---|---|
| DE | 19651961 | 6/1998 |
| EP | 0345493 | 12/1989 |
| EP | 1174781 | 1/2002 |

OTHER PUBLICATIONS

EP Appln No. 12 17 5579 European Search Report dated Nov. 27, 2012.

*Primary Examiner* — Man Phan
*Assistant Examiner* — Mewale Ambaye
(74) *Attorney, Agent, or Firm* — Boyle Fredrickson, S.C.

(57) ABSTRACT

A modular, high-availability network for an industrial control system employs a plurality of base modules having backplane and using network ring topology. Base modules may include I/O base modules for communicating with industrial processes or machines, an adapter base module for communicating with a programmable logic controller (PLC) and/or a bus expansion base module for providing additional I/O base modules. Base modules may be arranged side-by-side, having a backplane in a bank. Another embodiment may include having plurality of banks. The network ring topology used by the base modules is normally opened by a ring supervisor at the ring supervisor location. Upon failure of the network, the ring supervisor reconnects the ring to provide an alternative transmission path around the failure point.

11 Claims, 12 Drawing Sheets

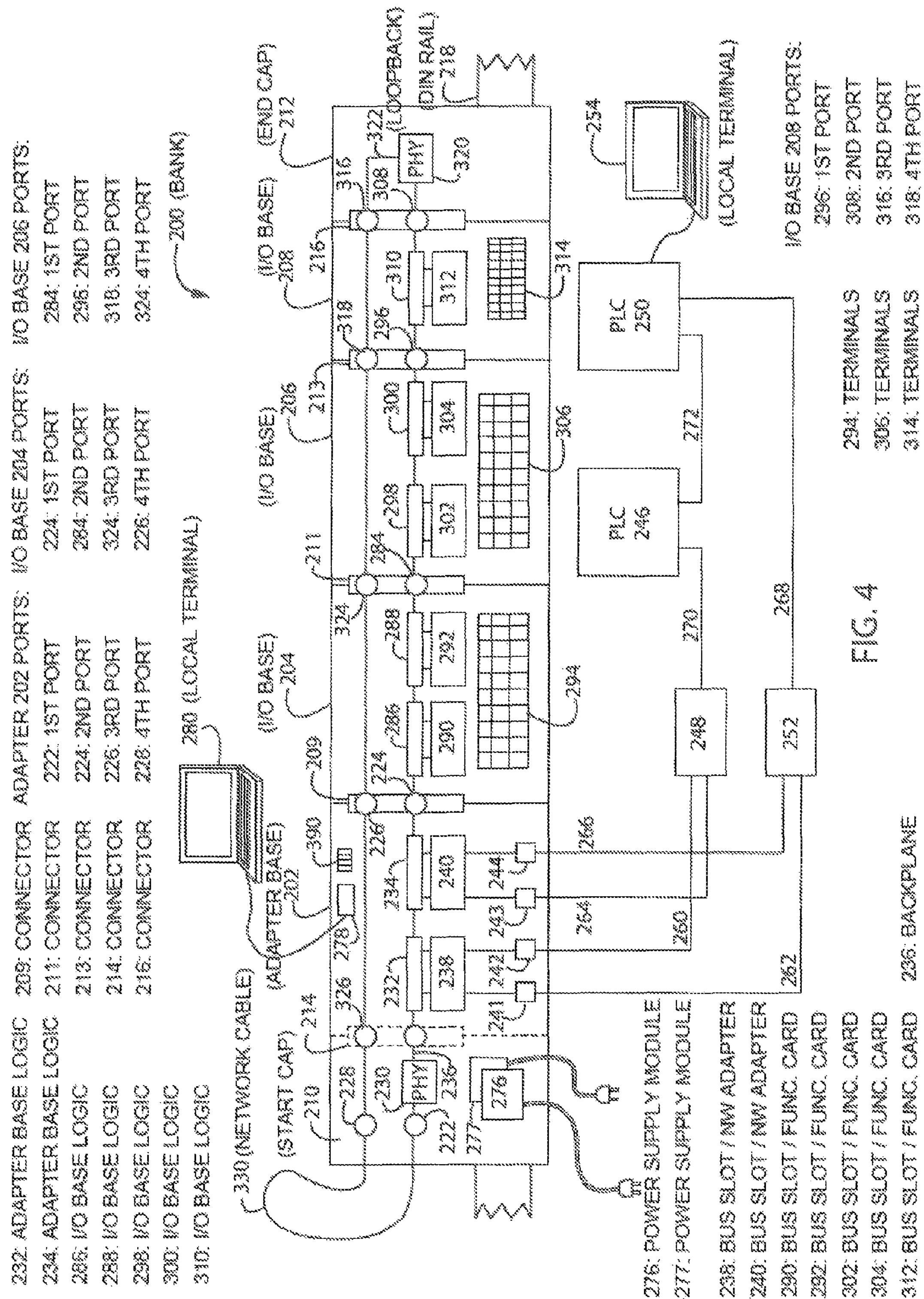
232: ADAPTER BASE LOGIC
234: ADAPTER BASE LOGIC
286: I/O BASE LOGIC
288: I/O BASE LOGIC
298: I/O BASE LOGIC
300: I/O BASE LOGIC
310: I/O BASE LOGIC
209: CONNECTOR
211: CONNECTOR
213: CONNECTOR
214: CONNECTOR
216: CONNECTOR
ADAPTER 202 PORTS:
222: 1ST PORT
224: 2ND PORT
226: 3RD PORT
228: 4TH PORT
I/O BASE 204 PORTS:
224: 1ST PORT
284: 2ND PORT
324: 3RD PORT
226: 4TH PORT
I/O BASE 206 PORTS:
284: 1ST PORT
296: 2ND PORT
318: 3RD PORT
324: 4TH PORT
200 (BANK)
330 (NETWORK CABLE)
280 (LOCAL TERMINAL)
(START CAP) 210
(ADAPTER BASE) 202
(I/O BASE) 204
(I/O BASE) 206
(I/O BASE) 208
(END CAP) 212
322 (LOOPBACK)
(DIN RAIL) 218
PHY
PLC 246
PLC 250
254
(LOCAL TERMINAL)
248
252
FIG. 4
276: POWER SUPPLY MODULE
277: POWER SUPPLY MODULE
238: BUS SLOT / NW ADAPTER
240: BUS SLOT / NW ADAPTER
290: BUS SLOT / FUNC. CARD
292: BUS SLOT / FUNC. CARD
302: BUS SLOT / FUNC. CARD
304: BUS SLOT / FUNC. CARD
312: BUS SLOT / FUNC. CARD
236: BACKPLANE
294: TERMINALS
306: TERMINALS
314: TERMINALS
I/O BASE 208 PORTS:
296: 1ST PORT
308: 2ND PORT
316: 3RD PORT
318: 4TH PORT

HIGH AVAILABILITY DEVICE LEVEL RING BACKPLANE

CROSS-REFERENCES TO RELATED APPLICATIONS

This application claims a benefit of priority under 35 USC §119 based on provisional patent application Nos. 61/505,888 and 61/505,892, each filed Jul. 8, 2011, each of which the entire contents are hereby expressly incorporated by reference into the present application.

BACKGROUND OF THE INVENTION

The present invention relates to industrial control systems and, in particular, a modular, high-availability industrial system using a network ring.

Industrial controllers, such as programmable logic controllers (PLC's), are specialized electronic computer systems used for the control of industrial processes or machinery, for example, in a factory environment. Industrial controllers differ from conventional computers in a number of ways. Physically, they are constructed to be substantially more robust against shock and damage and to better resist external contaminants and extreme environmental conditions. The processors and operating systems are optimized for real-time control and execute languages allowing ready customization of programs to comport with a variety of different controller applications. Industrial controllers may have a user interface for accessing, controlling and/or monitoring the industrial controller, such as through a locally connected terminal having a keyboard, mouse and display.

Typically, industrial controllers have a modular architecture that allows different numbers and types of network cards or adapters to be used to connect the controllers to the process or machinery to be controlled through special "control networks" suitable for highly reliable and available real-time communication. Such control networks commonly used in industrial control systems include, for example, ControlNet, DeviceNet, EtherNet/IP and Sercos, whose specifications are published and whose protocols are used broadly by a number of manufacturers and suppliers. Control networks differ from standard communication networks, such as Ethernet, by guaranteeing maximum communication delays. This may be obtained, for example, by pre-scheduling the bandwidth of the network and/or providing redundant communication capabilities to high-availability. Control networks also differ from one another in physical aspects, for example, the type of media (e.g., co-axial cable, twisted pair, light fiber, etc.), the protocols of its operation, (e.g., Baud rate, number of channels, word transmission size, use of connected messaging, etc.) and how the data is formatted and how it is collected into standard messages.

Many networks also incorporate protocols to repair the network in the event of network node failure. These protocols can take a relatively long time to reconnect the network (as much as 30 seconds) and thus are unacceptable for industrial control networks where the controlled process cannot be undirected during this period without disastrous consequences.

The risk of debilitating network failure in an industrial control can often be reduced using a redundant network topology, for example, where network nodes are connected in a ring with a supervisor. Normally the ring is opened at the supervisor node for all standard data and thus operates in a normal linear topology. The supervisor may send out test "telegram" or "beacon" frames in one direction on the ring which are received back at the supervisor in the other direction to indicate the integrity of the ring. If the ring is broken, such as by a node or media failure, the supervisor joins the ends of the ring to produce once again a continuous linear topology now separated by the failed component. Changes in the mode of operation of the supervisor from "separated" to "joined" may be transmitted to the other nodes using notification frames so that these nodes can rebuild their MAC address routing tables used to associate a port with a destination address.

The error detection time of such ring systems can be quite fast, limited principally by the transmission rate of the beacons (every several milliseconds). This rate defines the maximum time before which an error is detected and the ring may be reconfigured.

Also, as part of their enhanced modularity, industrial controllers may employ one or more industrial devices coupled through the control networks. Industrial devices may comprise one or more I/O modules dedicated to a particular type of industrial function, for example, detecting input AC or DC signals or controlling output AC or DC signals in conjunction with an industrial process, or running motors or other machinery. Each I/O module may have a connector system allowing them to be installed in different combinations in an industrial device along with other selected I/O modules to match the demands of the particular application. Multiple industrial devices may be located at convenient control points near the controlled process or machine to communicate with the industrial controller via the control network.

Industrial systems may require flexibility for adding, removing and/or modifying industrial controllers and industrial devices. For example, it may be desirable to add a new industrial process via a new industrial device, thereby increasing the capability or capacity of the industrial system. Similarly, it may be desirable to modify or remove an existing industrial controller or industrial device due to changes in, requirements in the industrial system, such as a controlled process or machine that has become obsolete. In addition, in some applications, industrial controllers and/or industrial devices might require addition, removal or modification while the industrial system is actively running. This may occur, for example, when interrupting the process would cause costly downtime and/or product defects.

Industrial systems, including industrial controllers and industrial devices, like many other systems, may also be susceptible to various faults occurring throughout the system. For example, the electronics held within an industrial controller or industrial device, the network connection or I/O connection or function card, or the power source, may all be potential points of failure due to a number of conditions. However, in certain industrial systems requiring high-availability for running critical applications, a failure occurring at any point could lead to potentially catastrophic conditions.

SUMMARY OF THE INVENTION

Aspects of the present invention provide a backplane for an industrial control system comprising an adapter base module having a first port, a second port, a switching node and a network adapter, the switching node coupled between the first port and the second port and in communication with the network adapter, the network adapter operable to communicate over a control network; a plurality of I/O bases, each I/O base module having a first port, a second port and a bus slot, the bus slot for releasably receiving a function card having a switching node, wherein each I/O base module couples the first port and the second port to the switching node when the function card is installed in the bus slot, and each I/O base module couples the first port to the second port when the function card is absent from the bus slot; and at least one I/O base module having a function card installed in the bus slot. The second port of the adapter base module is coupled to the first port of an I/O base, and the second port of each I/O base module is coupled to the first port of the next I/O base, except the last I/O base module having the second port coupled to the first port of the adapter base module to form a network ring of switching nodes.

Each switching node may contain a unique node address in the ring, and each bus slot, may be assigned a unique physical address independent of the unique node address. The unique node address may be determined by MAC address. The unique physical address may be determined by address definition lines communicating between each bus slot. Each I/O base module may further comprise a plurality of terminals for releasably receiving electrical conductors communicating with a controlled process or machine.

The adapter base module and the plurality of I/O base modules may each have a third port and a fourth port that are coupled together, wherein the second port of the last I/O base module is coupled to the third port of the last I/O base, and the fourth port of each I/O base module is coupled to the third port of the previous I/O base, except the first I/O base module having the fourth, port coupled to the third port of the adapter base, the fourth port of the adapter base module coupled to the first port of the adapter base module to form the network ring. The second port and the third port may be part of a first electrical connector and the first port and the fourth port may be part of a second electrical connector. The second port of the last I/O base module may be coupled to the third port of the last I/O base module via an externally attached end cap enclosure. The fourth port of the adapter base module may be coupled to the first port of the adapter base module via an externally attached network cable.

One of the switching nodes may be an active ring supervisor adapted to operate to (a) transmit beacon frames out of each port at a first rate and monitor the other port for reception of beacon frames, wherein the beacon frames indicate a state of operation of the ring network as a closed mode or an open mode; (b) respond to a receipt of beacon frames between the first and second ports by blocking data frames between the first and second ports in an open mode; (c) respond to failure of the beacon frames to traverse the ring by changing to a closed mode passing data frames between the first and second ports; and wherein switching nodes that are not the active ring supervisor may be adapted to operate to: (a) pass beacon frames between the first and second ports; (b) respond to a change in the state of operation of the ring network deduced from either (i) non-receipt of beacon frames on either port or; (ii) receipt of beacon frames indicating a change in operating between closed mode or open mode to reset their MAC address routing tables.

The adapter base module may further comprise a first bus slot for releasably receiving a first function card containing a switching node in communication with the network adapter, and a second bus slot for releasably receiving a second function card containing a switching node in communication with a second network adapter, wherein the adapter base: (a) couples the first port and the second port to the switching node of the first function card when the first function card is installed in the first bus slot and the second function card is absent from the second bus slot; (b) couples the first port and the second port to the switching node of the second function card when the second function card is installed in the second bus slot and the first function card is absent from the first bus slot; and (c) couples the first port to the switching node of the first function card, couples the switching node of the first function card to the switching node of the second function card, and couples the second port to the switching node of the second function card when the first function card is installed in the first bus slot and the second function card is installed in the second bus slot.

The I/O base module may further comprise a second bus slot, the second bus slot for releasably receiving a second function card having a switching node, wherein the I/O base: (a) couples the first port and the second port to the switching node of the first function card when the first function card is installed in the first bus slot and the second function card is absent from the second bus slot; (b) couples the first port and the second port to the switching node of the second function card when the second function card is installed in the second bus slot and the first function card is absent from the first bus slot; (c) couples the first port to the switching node of the first function card, couples the switching node of the first function card to the switching node of the second function card, and couples the second port to the switching node of the second function card when the first function card is installed in the first bus slot and the second function card is installed in the second bus slot; and (d) couples the first port to the second port when both function cards are absent from the bus slots.

Another embodiment of the present invention provides an industrial control system comprising a plurality of banks, each bank including a plurality of I/O bases, each I/O base module having a first port, a second port, and a bus slot, the bus slot for releasably receiving a function card having a switching node, wherein each I/O base module couples the first port and the second port to the switching node when the function card is installed in the bus slot, and each I/O base module couples the first port to the second port when the function card is absent from the bus slot, at least one I/O base module having a function card installed in the bus slot. The first bank includes an adapter base module having a first port, a second poi t, a switching node and a network adapter, the switching node coupled between the first port and the second port and in communication with the network adapter, the network adapter operable to communicate over a control network. The adapter base module in the first bank has a second port coupled to the first port of an I/O base module in the same bank, the second port of each I/O base module in each bank is coupled to the first port of the next I/O base module in the same bank, except the last I/O base module in each bank having the second port coupled to the first, port of the first I/O base module in the next bank, except the last I/O base module in the last bank having the second port coupled to the first port of the adapter base module in the first bank to form a network ring of switching nodes.

Yet another embodiment of the present invention provides an I/O base module for an industrial system comprising an enclosure providing left and right flanking sides; releasable electrical connectors supported on the left and right flanking sides exposed to connect adjacent base modules on the left and right sides; a releasable mechanical connector for holding the base module to adjacent base modules on the left and right sides; a plurality of electrical terminals for receiving conductors exposed on a surface of the enclosure to releasably retain electrical conductors communicating with an I/O function card held within the enclosure; and backplane circuitry held within the enclosure and communicating with the releasable electrical connectors to establish a ring network communicating among attached base modules to provide a first port at one electrical connector and a second port at the second electrical connector so that the base modules may be arranged in a ring wherein the first and second ports of each base module couple to a different base module of the ring. The releasable mechanical connector may be adapted to hold the base module to the adjacent base modules by attachment to a DIN rail.

These and other objects, advantages and aspects of the invention will become apparent from the following description. The particular objects and advantages described herein may apply to only some embodiments falling within the claims and thus do not define the scope of the invention. In the description, reference is made to the accompanying drawings which form a part hereof and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

FIG. 4 is a simplified functional diagram of a bank of base modules in accordance with an embodiment of the present invention;

DETAILED DESCRIPTION OF THE PREFERRED EMBODIMENT

The present inventors have recognized that high-availability, scalability and flexibility may be achieved in industrial control systems utilizing base modules with one or more common backplanes configured in a device level ring and hardware redundancy. In a network ring, fast recovery times may be achieved by communicating a topology change in the beacon frame, along with monitoring reception or non-reception of beacon frames in switching nodes. Such an approach practically requires switching nodes in the backplane to provide hardware processing of the beacon'frames, so that the nodes can monitor reception or non-reception of the beacon frame along with data in the beacon frame, rather than, simply passing the beacons from port to port.

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

Figure 1:
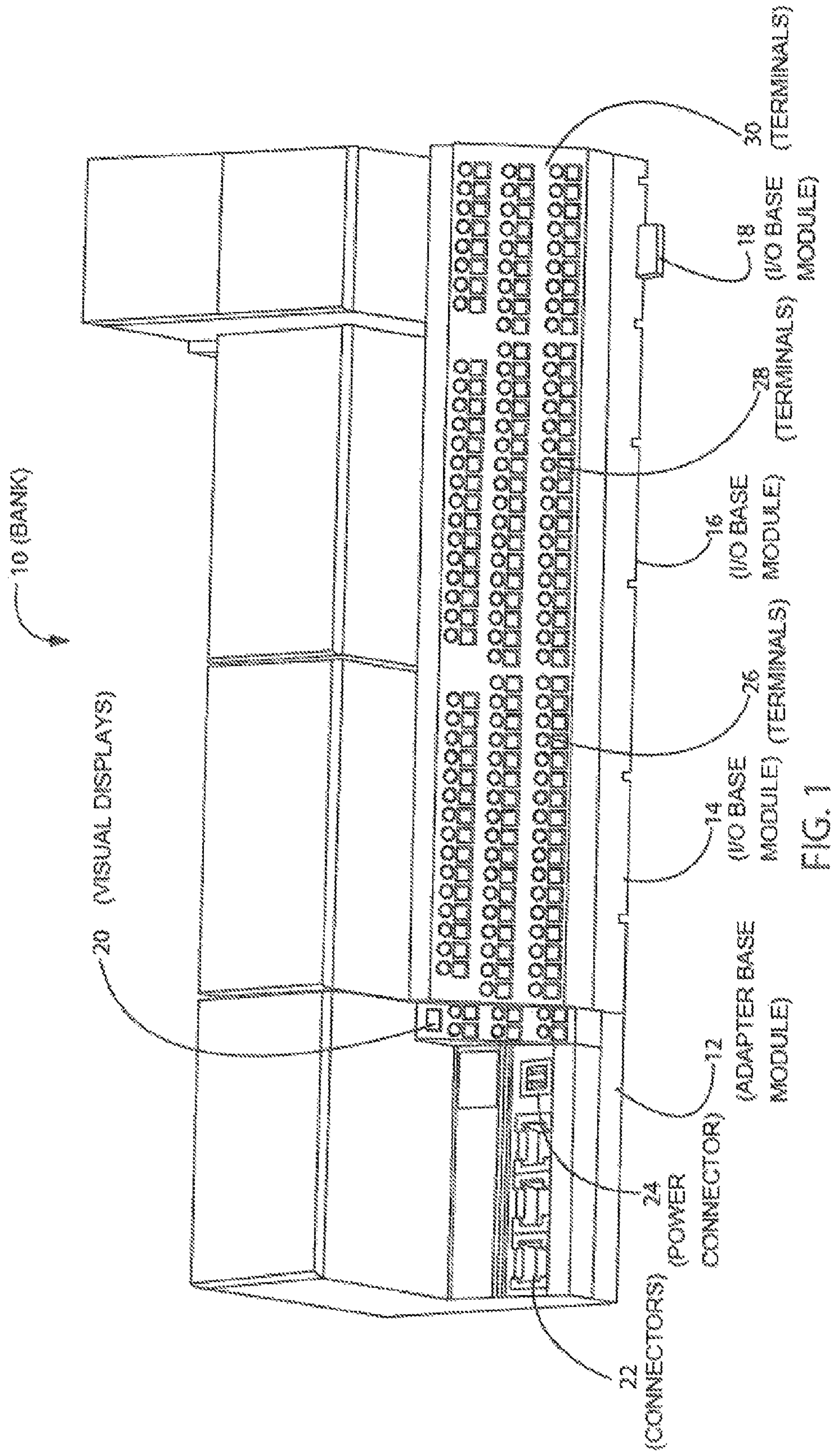
FIG. 1 is an isometric view of a bank of base modules for an industrial control system in accordance with an embodiment of the present invention.

Referring now to the drawings wherein like reference numbers correspond to similar components throughout the several views and, specifically, referring to FIG. 1, the present invention shall be described in the context of a bank of base modules 10 for an industrial control system in accordance with an embodiment of the present invention. The bank of base modules 10 includes a series of enclosures arranged from left to ride, side by side, with complex shapes that may be generally described as cubic. The series of enclosures include a left most adapter base module 12, followed by a first double, vertical terminal I/O base module 14, followed by a second double, vertical terminal I/O base module 16, followed by a right most single, vertical terminal I/O base module 18. Each base module is held in close proximity to the other, thereby facilitating electrical connections side by side. Each base module may be held by attachment to a DIN rail. In an alternative embodiment, one or more base modules may be held with greater separation and having electrical connections supported by network cabling. Each base module further comprises electrical connectivity and base logic to facilitate a common system backplane among each base module, as well as one or more internally held bus slots for releasably receiving one or more function cards and/or equivalently embedded logic.

Adapter base module 12 may further comprise a plurality of various connectors 22, as well as visual displays 20 and/or LED's for system monitoring, located on one or more respective surfaces. Possible connectors may include, for example, a plurality of RJ-45 network connectors for network ring connectivity of the bank and for PLC access, a Universal Serial Bus (USB) and/or IEEE 1394 connector for a locally connected terminal, and a power connector 24 for powering the bank, as well as any other advantageous connector as known in the art. I/O base modules 14, 16 and 18 may further comprise a plurality of electrical terminals (or terminal blocks) 26, 28 and 30, respectively, for receiving conductors exposed on the surface of each enclosure to releasably retain electrical conductors communicating with an I/O function card held within the enclosure. The electrical conductors may couple and communicate with respective controlled processes or machines (not shown). Each I/O base module may resemble the other in size, color and shape, though these aspects may differ by function. For example, the right most single, vertical terminal I/O base module 18 may be taller and narrower than the first and second double, vertical terminal I/O base modules 14 and 16. In addition, in a system comprising a plurality of banks in a network ring, each of the additional, banks may, have a simplified bus expansion base module instead of the adapter base module to thereby support additional backplanes in the additional banks. A bus expansion module need not provide, for example, network adapting for PLC's.

Figure 2:
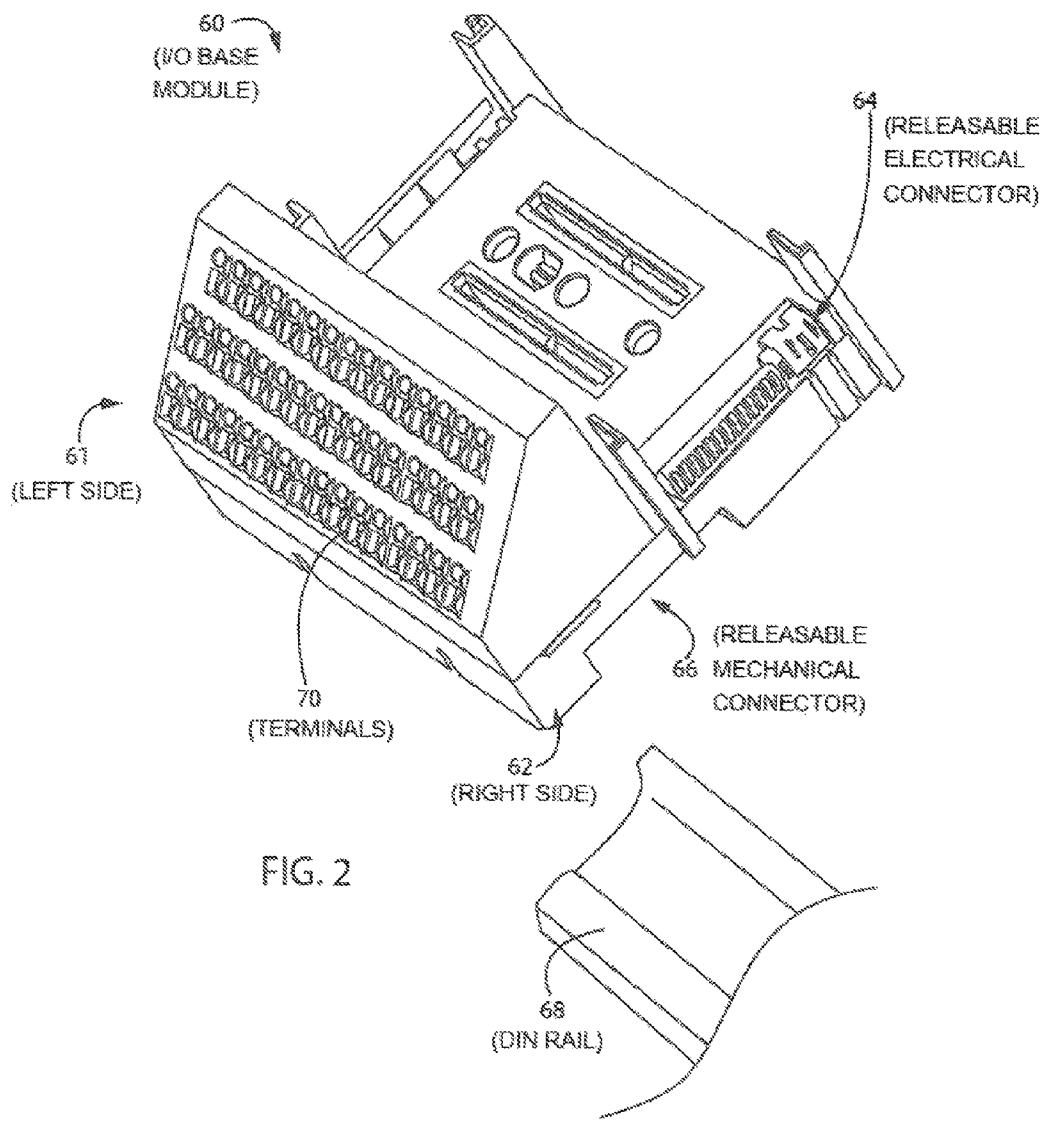
FIG. 2 is an isometric view of a single, horizontal I/O base module in accordance with an embodiment of the present invention.

Referring now to FIG. 2, an, example isometric view of a single, horizontal terminal I/O base module 60 in accordance with an embodiment of the present invention is shown. I/O base module 60 may comprise an enclosure providing a left flanking side 61 and a right flanking side 62. Each side may further comprise a releasable electrical connector 64 with a mechanical mechanism supported on each flanking side exposed to connect adjacent base modules on the left and right sides. I/O base module 60 may further comprise a releasable mechanical connector 66 for holding the base module to the adjacent base units on the left and right sides. The releasable mechanical connector may be adapted to hold the base module to the adjacent base modules by attachment to a DIN rail 68. As described above, I/O base modules 60 may further comprise a plurality of electrical terminals (or terminal blocks) 70 for receiving conductors exposed on the surface of the enclosure to releasably retain electrical conductors communicating with an I/O function card held within the enclosure. The electrical conductors may couple and communicate with respective controlled processes or machines (not shown). I/O base module 60 may also comprise various other connectors, labeling, visual displays and/or LED's as desirable and known in the art.

Figure 3:
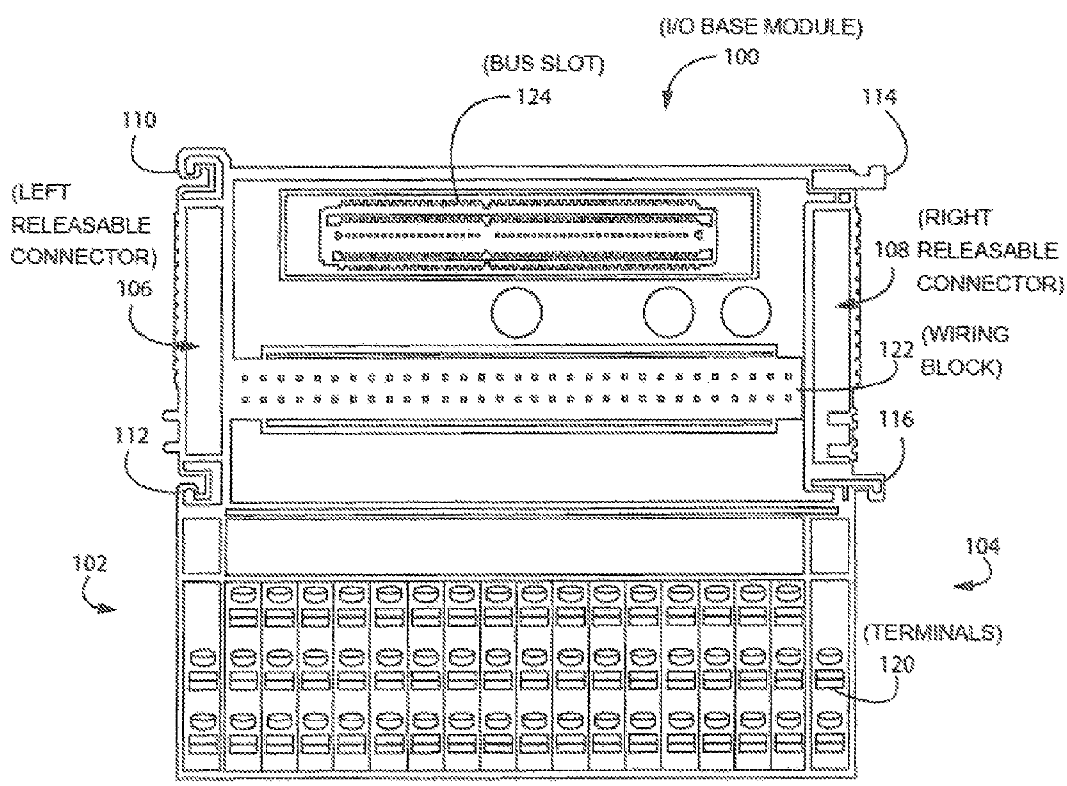
FIG. 3 is a cutaway top view of a single, horizontal terminal I/O base module in accordance with an embodiment of the present invention.

Referring now to FIG. 3, a cutaway top view of a single, horizontal terminal I/O base module 100 in accordance with an embodiment of the present invention is shown. I/O base module 100 comprises an enclosure having a left flanking side 102 and a right flanking side 104. The left and right flanking sides support the left releasable electrical connector 106 and the right releasable electrical connector 108, respectively, which are exposed to connect adjacent base modules. The left releasable electrical connector 106, comprising aspects 110 and 112, may be of an opposite configuration and/or mating type than the right releasable electrical connector 108, comprising aspects 114 and 116, although a system of universal releasable electrical connector mating types may be used In a preferred embodiment, electrical connectors with shrouded pins may be used. The left releasable electrical connector 106 and the right releasable electrical connector 108 provide backplane connectivity with adjacent base modules.

I/O base module 100 may further comprise a plurality of electrical terminals (or terminal blocks) 120 for receiving conductors exposed on the surface of the enclosure to releasably retain electrical conductors communicating with an I/O function card held within the enclosure. The electrical conductors may couple and communicate with respective controlled processes or machines (not shown). Within I/O base module 100, the conductors may individually route from the electrical terminals or terminal blocks) 120 to an internal vertical wiring block 122 in various wiring arrangements as may be desired. The wiring block 122 may in turn route to the horizontal bus slot 124. The bus slot 124 may releasably receive an I/O function card (having a switching node) for interacting with the backplane via a first channel and the wiring block via a second channel.

In an alternative embodiment, wiring block 122 and bus slot 124 may instead be arranged vertically. Bus slot 124 could also be a self shorting electrical connector in which electrical signals pass-through the bus slot in the absence of a function card. In a preferred embodiment, a plurality of internal wiring blocks and bus slots may be provided in a single I/O base module, vertically or horizontally, as may be desired. Such an arrangement may serve to provide fault-tolerant redundancy for a high-availability system. In addition, in a preferred embodiment, a single, horizontal terminal adapter base module, or a bus expansion base module, may include similar enclosure dimensions as the I/O base module 100, as well as a similar bus slot 124 (or plurality of bus slots in a preferred embodiment) and similar right releasable electrical connector 108; but might not include the plurality of electrical terminals (or terminal blocks) 120, the wiring block 122 or the left releasable electrical connector 106.

Referring now to FIG. 4, a simplified functional diagram of a first bank of base modules 200 in accordance with an embodiment of the present invention is shown. The first bank of base modules 200 includes a series of enclosures arranged from left to ride, side by side. The series of enclosures include a left most double adapter base module 202, followed next by a first double terminal I/O base module 204, followed next by a second double terminal I/O base module 206, followed lastly by a single terminal I/O base module 208, and followed by a right most end cap enclosure module 212. The end cap enclosure module 212 may contain a loopback for the network ring. Each base module is held in close proximity to, the other, thereby facilitating electrical connections side by side. Adapter base module 202 is releasably electrically connected to I/O base module 204 via releasable electrical connector 209, I/O base module 204 is releasably electrically connected to I/O base module 206 via releasable electrical connector 211, I/O base module 206 is releasably electrically connected to I/O base module 208 via releasable electrical connector 213, and I/O base module 208 is releasably electrically connected to the end cap enclosure module 212 via releasable electrical connector 216. Optionally, the left most area 210 of the first bank of base modules 200 may comprise a start cap enclosure module separate from the adapter base module 202, in which case, the may be releasably electrically connected to adapter base module 202 via releasable electrical connector 214, and may contain, for example, connections to complete the network ring. Similarly, the right most end cap enclosure module 212 may be optionally integrated with the last I/O base module, however, doing so may result in removal of the last I/O base module for adding any further I/O base modules, or for replacing any components normally contained in the end cap enclosure module. Each base module may be held by attachment to a DIN rail 218.

The adapter base module 202 may comprise a first port 222, a second port 224, a third port 226 and a fourth port 228. The second port 224 and the third port 226 may be part of the same releasable electrical connector 209, which ports and connection may be shared by connection to the next base module. The adapter base module 202 may also comprise a physical layer "PHY" component 230 coupled to the first port 222, a first adapter base logic 232 coupled to the PHY 230, a second adapter base logic 234 coupled to the first adapter base logic 232, and the second port 224 coupled to the second adapter base logic 234. The PHY 230 may provide a Serial Gigabit Media Independent Interface (SGMII) for the backplane 236. The first adapter base logic 232 couples the backplane 236 to a bus slot and a network adapter (containing a switching node) 238 when the network adapter is installed in the bus slot. The bus slot and network adapter 238 in turn couple the backplane 236 to the second adapter base logic 234. The second adapter base logic 234 similarly couples the backplane 236 to a bus slot and network adapter (containing a switching node) 240 when the network adapter is installed in the bus slot. The bus slot and network adapter 240 in turn couple the backplane 236 to the second port 224 of the adapter base module 202. If a network adapter is absent from either bus slot, or if a network adapter is installed but does not enable the corresponding adapter base logic, then the corresponding adapter base logic will bypass the particular bus slot to complete the network ring. Communication may occur in either direction of the network ring, thereby providing increased fault tolerance against a port or switch failure. In another embodiment, either network adapter may be embedded in the adapter base module 202, thus not requiring a bus slot. In yet another embodiment, a third adapter base logic and third bus slot may be provided for yet another network adapter (containing a switching node), connected similarly as described above.

Each network adapter in the adapter base module 202 may further comprise one or more PHY components, which in turn provide connections to one or more industrial control networks. The bus slot and network adapter 238 may connect, for example, to RJ-45 network connectors 241 and 242, and the bus slot and network adapter 240 may connect to RJ-45 network connectors 243 and 244. In an advantageous topology, the bus slot and network adapter 238 may couple to a first PLC 246 via RJ-45 network connector 242 connecting to a first networking switch 248, which in turn connects to the first PLC 246, and via RJ-45 network connector 241 connecting to a second networking switch 252, which in turn connects to the second PLC 250. Similarly, the bus slot and network adapter 240 may couple to the first PLC 246 via RJ-45 network connector 243 connecting to a first networking switch 248, which in turn connects to the first PLC 246, and via RJ-45 network connector 244 connecting to the second networking switch 252, which in turn connects to the second PLC 250. The first PLC 246 and the second PLC 250 may couple together over a control network connection, and the second PLC 250 may also couple to a locally connected terminal 254. Each PLC may be executing a stored program to provide real-time control over the industrial system subject to well-defined maximum delay periods between the PLC and the controlled processes or machines (not shown). This topology may provide redundant industrial control network paths to the bank, though other topologies with or without network switches may be used for accessing and monitoring the industrial system.

The adapter base module 202 may also comprise a power supply module 276 for coupling to an external power source and for providing power to the adapter base module 202 and the rest of the bank via releasable electrical connectors 209, 211 and 213. The power supply module 276 may provide appropriate power conditioning and may be a removable module. The adapter base module 202 may further comprise a second power supply module 277 for increased fault-tolerance. The adapter base module 202 may also comprise a Universal Serial Bus (USB) connector 278 for providing a locally connected terminal 280 used for accessing and monitoring the bank.

The I/O base module 204 may comprise a first port 224, a second port 284, a third port 324 and a fourth, port 226. The I/O base module 204 may also comprise a first I/O base logic 286 coupled to the first port 224, a second I/O base logic 288 coupled to the first I/O base logic 286, and the second port 284 coupled to the second I/O base logic 288. The first I/O base logic 286 couples the backplane 236 to a bus slot and an I/O function card (containing a switching node) 290 when the function card is installed in the bus slot. The bus slot and function card 290 in turn couples the backplane 236 to the second I/O base logic 288. The second I/O base logic 288 similarly couples the backplane 236 to a bus slot and I/O function card (containing a switching node) 292 when the function card is installed in the bus slot. The bus slot and function card 292 in turn couples the backplane 236 to the second port 284 of the I/O base module 204. If a function card is absent from either bus slot, or if a function card is installed but does not enable the corresponding I/O base logic, then the corresponding I/O base logic will bypass the bus slot to complete the network ring. Each bus slot and function card may also communicate with a respective wiring block (not shown) and a plurality of electrical terminals (or terminal blocks) 294 for receiving conductors exposed on the surface of each enclosure to releasably retain electrical conductors communicating with the function card held within the enclosure. The electrical conductors may couple and communicate with respective controlled processes or machines (not shown). In another embodiment, a third I/O base logic and third, bus slot may be provided for yet another I/O function card (containing a switching, node), connected similarly as described above.

I/O base modules 206 and 208 operate similarly to I/O base module 204. The last I/O base module 208 differs somewhat in that it is a single, terminal I/O base module having only one I/O base logic and one bus slot and I/O function card (containing a switching node). For example, I/O base module 208 may comprise a first port 296, a second port 308, a third port 316 and a fourth port 318. The I/O base module 208 may also comprise a single I/O base logic 310 coupled to the first port 296, and the second port 308 coupled to the single I/O base logic 310. The single I/O base logic 310 couples the backplane 236 to a single bus slot and an I/O function card (containing a switching node) 312 when the function card is installed in the bus slot. The bus slot and function card 312 in turn couples the backplane 236 to the second port 308. If a function card is absent from the single bus slot, or if a function card is installed but does not enable the single I/O base logic, then the corresponding I/O base logic will bypass the bus slot to complete the network ring. The bus slot and function card may also communicate with a respective wiring block (not shown) and a plurality of electrical terminals (or terminal blocks) 314 for receiving conductors exposed on the surface of each enclosure to releasably retain electrical conductors communicating with the function card held within the enclosure. The electrical conductors may couple and communicate with respective controlled processes or machines (not shown).

End cap enclosure module 212 may integrate the loopback for the backplane network ring and provide a physical cover for the last I/O base module. The end cap enclosure module 212 may comprise a first port 308, a physical layer "PHY" component 320 and a second port 316. The first port 308 couples to the PHY 320, which may provide, for example, a Gigabit EtherNet/IP loopback 322 from the backplane to form the network ring. The loopback 322 may in turn couple to the second port 316 of the end cap enclosure module 212, which may in turn couple to the previous I/O base module 208 at the third port 316 of the I/O base module 208. The I/O base module 208 may in turn couple the loopback 322 to the fourth port 318 of the I/O base module 208, which may in turn couple to the previous I/O base module 206 at the third port 318 of the I/O base module 206. The I/O base module 206 may in turn couple the loopback 322 to the fourth port 324 of the I/O base module 206, which may in turn couple to the first I/O base module 204 at the third port 324 of the I/O base module 204. The'I/O base module 204 may in turn couple the loopback 322 to the fourth port 226 of the I/O base module 204, which may in turn couple to the adapter module 202 at the third port 226 of the adapter base module 202. The adapter base module 202 may in turn couple the loopback 322 to the fourth port 228 of the adapter base module 202, which may in turn be coupled to the first port 222 of the adapter base module 202 via an externally attached network cable 330. As such, the loopback 322 is routed back through the first bank of base modules 200 to form the network ring.

Alternative arrangements for connecting base modules to form the network ring may also be provided. For example, in another arrangement, the I/O base module 204 may couple the first port 224 to the third port 324 bypassing the I/O base logic, bus slots and function cards, and also couple the fourth port 209 to the I/O base logic 286, and couple the I/O base logic 286 to the I/O base logic 288, and couple the I/O base logic 288 to the second port 284, thereby forming a criss-cross arrangement. Moreover, the criss-cross arrangement may occur, for example, in every base module, or select base modules, advantageously eliminating the PHY 320 in the end cap enclosure module 212.

Figure 5:
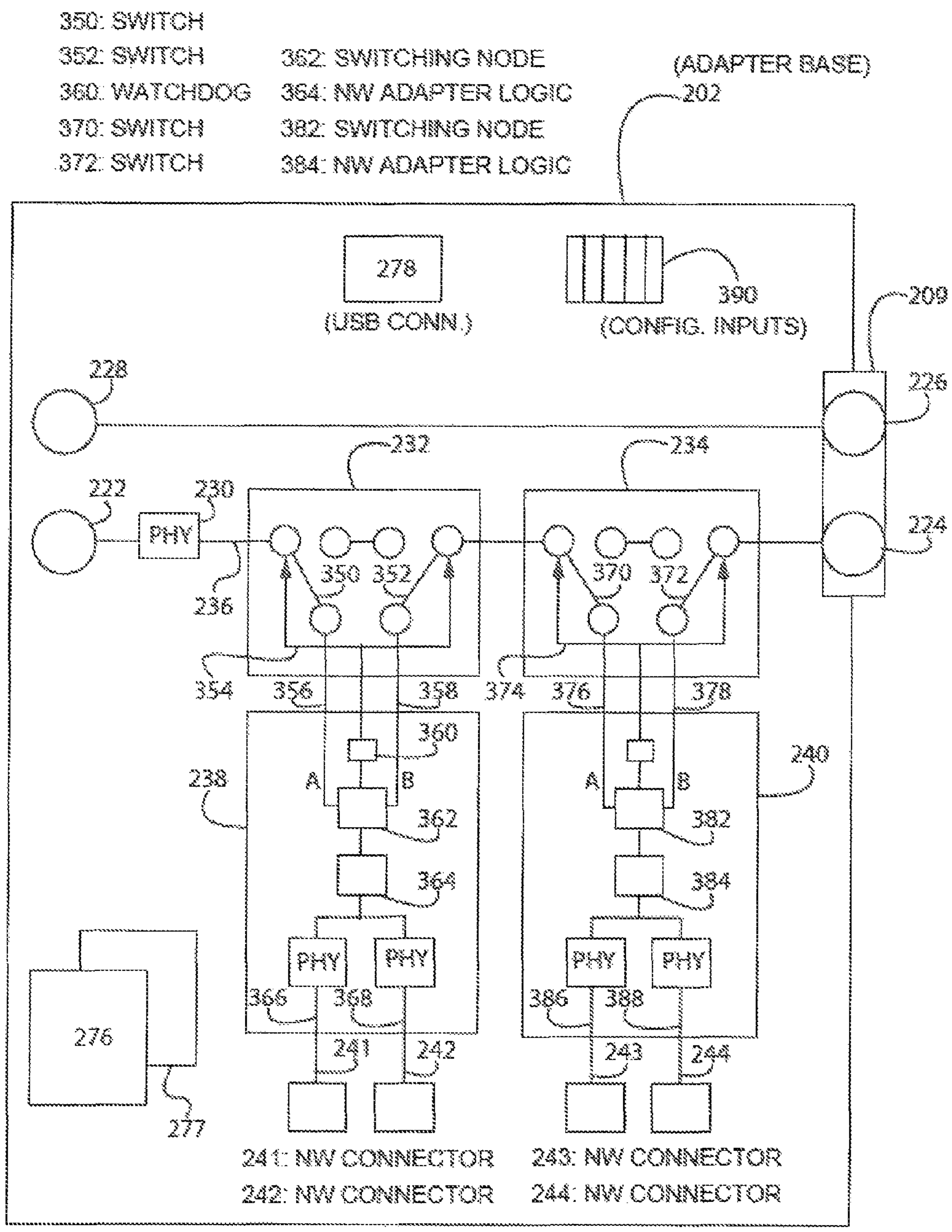
FIG. 5 is a simplified functional diagram of an adapter base module in accordance with an embodiment of the present invention.

Referring now to FIG. 5, a simplified functional diagram of the adapter base module 202 in accordance with an embodiment of the present invention is shown. The first adapter base logic 232 may be comprised of a first switch 350 and a second switch 352, each switch operating in the same state, wherein a first state of the switches routes the backplane 236 to the second adapter base logic 234 and bypasses the bus slot and network adapter 238, and wherein a second state of the switches routes the backplane 236 to the bus slot and network adapter 238 via a first path 356 and routes via a second (return) path 358 from the bus slot and network adapter 238 to the second adapter base logic 234. The default mode of the switches may be the first state in which the backplane 236 is routed to the second adapter base logic 234 and bypasses the bus slot and network adapter 238. The switches may change to the second state, for example, after a network adapter is installed in the bus slot, completes a built in self-test and communicates proper operation to a watchdog 360 which in turn provides an enable signal 354 to the switches. The watchdog 360 may de-assert the enable signal, for example, if the network adapter, after being installed, completing the built in self-test, and communicating proper operation to the watchdog 360, faults and thus fails to maintain communication of proper operation to the watchdog 360. As such, a faulted network adapter may be safely removed from the network ring.

The network adapter 238 may comprise a switching node 362 having a first port ("A") coupled to the first path 356 and a second port ("B") coupled to the second (return) path 358. The switching node 362 may, upon completion of the built in self-test, maintain communication of proper operation to the watchdog 360. The switching node 362 may also communicate network ring data with network adapter logic 364, which may in turn couple to PHY components 366 and 368, which may in turn connect to RJ-45 network connectors 241 and 242 for communication over a control network. The second adapter base logic 234 and bus slot and network adapter (containing a switching node) 240 may operate similarly as described above. As such, the adapter base module 202 may provide a fault-tolerant, redundant industrial control network path. The network adapter base module 202, as well as bus expansion base modules, may also comprise a plurality of manually configurable inputs 390, such as DIP switches, for configuring a physical address space offset for use within each bank.

Figure 6:
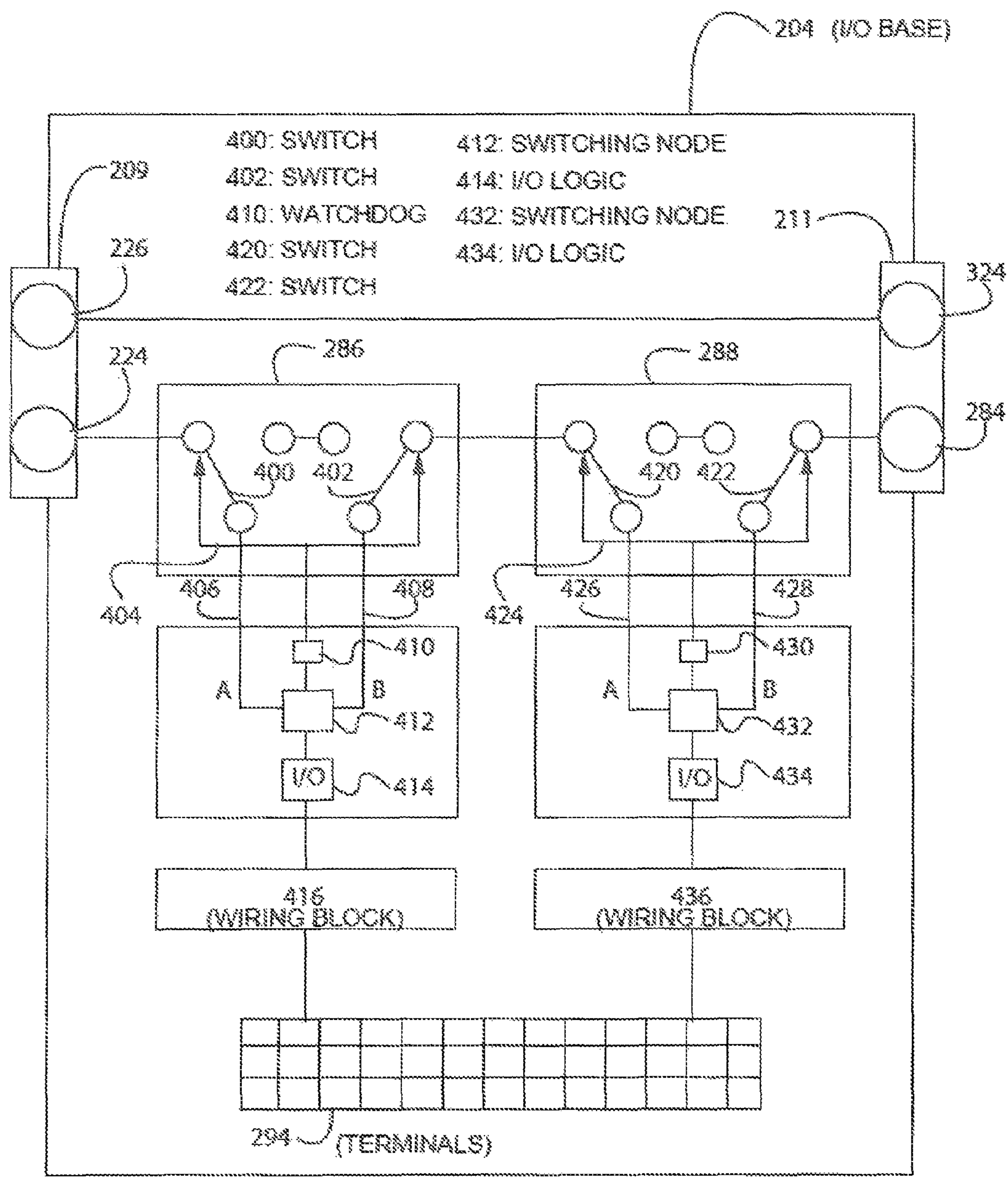
FIG. 6 is a simplified functional diagram of an I/O base module in accordance with an embodiment of the present invention.

Referring now to FIG. 6, a simplified functional diagram of an I/O base module in accordance with an embodiment of the present invention is shown. The first I/O base logic 286 may be comprised of a first switch 400 and a second switch 402, each switch operating in the same state, wherein a first state of the switches routes the backplane 236 to the second I/O base logic 288 and bypasses the bus slot and function card 290, and wherein a second state of the switches routes the backplane 236 to the bus slot and function card 290 via a first path 406 and routes via a second (return) path 408 from the bus slot and function card 290 to the second I/O base logic 288. The default mode of the switches may be the first state in which the backplane 236 is routed to the second I/O base logic 288 and bypasses the bus slot and function card 290. The switches may change to the second state, for example, after a function card is installed in the bus slot, completes a built in self-test and communicates proper operation to a watchdog 410 which in turn provides an enable signal 404 to the switches. The watchdog 410 may de-assert the enable signal, for example, if the function card, after being installed, completing the built in self-test, and communicating proper operation to the watchdog 410, faults and thus fails to maintain communication of proper operation to the watchdog 410. As such, a faulted function card may be safely removed from the network ring.

The function card 290 may comprise a switching node 412 having a first port coupled to the first path 406 and a second port coupled to the second (return) path 408. The switching node 412 may, upon completion of the built in self-test, maintain communication of proper operation to the watchdog 410. The switching node 412 may also communicate network ring data with I/O logic 414, which may in turn couple to the respective wiring block 416, which may in turn connect to the plurality of electrical terminals (or terminal blocks) 294 for receiving conductors exposed on the surface of each enclosure to releasably retain electrical conductors communicating with the function card held within the enclosure. The second I/O base logic 288 and the bus slot and function card (containing a switching node) 292 may operate similarly as described above. As such, the I/O base module 204 may provide a fault-tolerant, redundant communication with respective controlled processes or machines (not shown).

Figure 7:
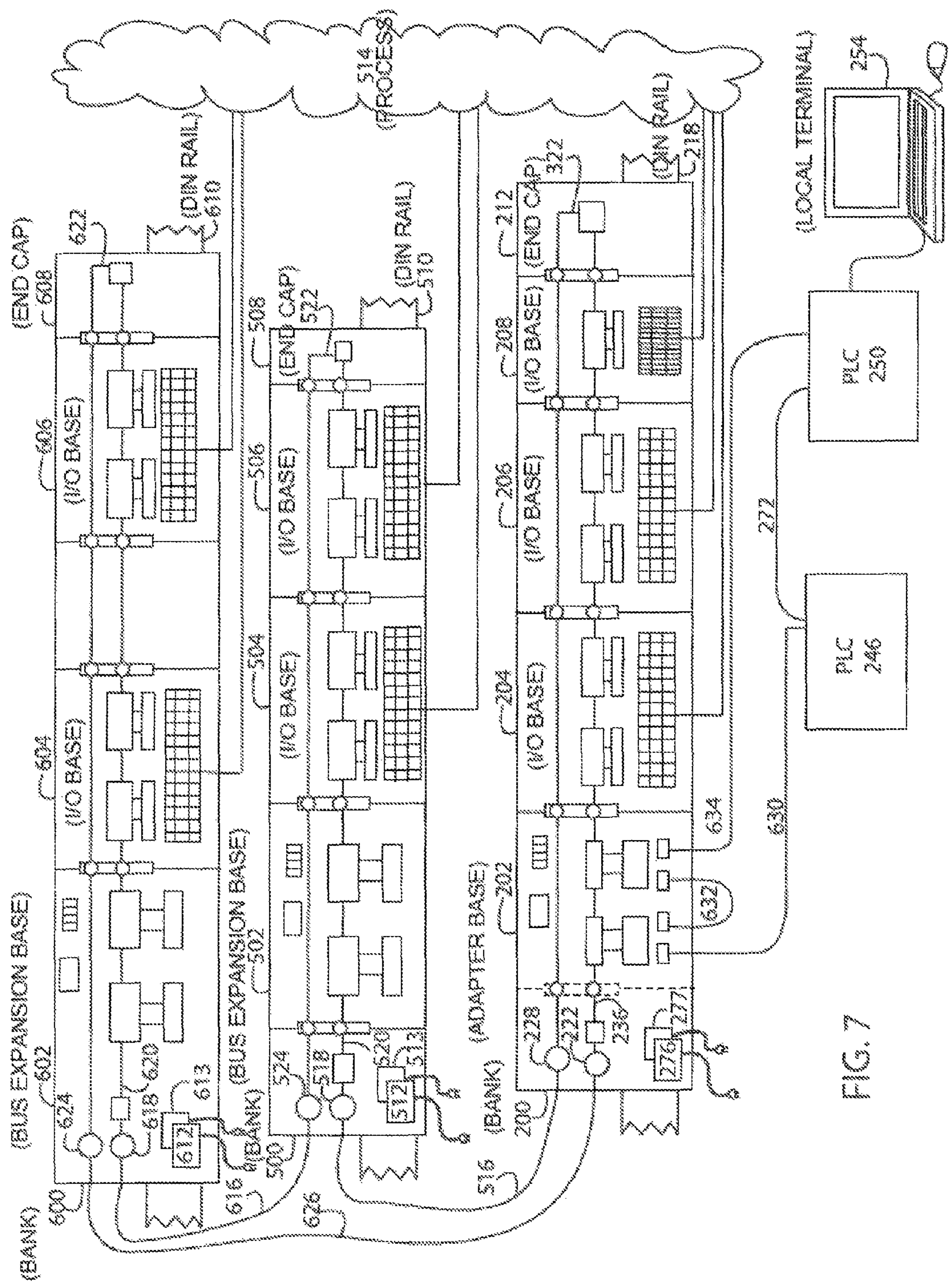
FIG. 7 is a simplified functional diagram of a plurality of banks in accordance with an embodiment of the present invention.

Referring now to FIG. 7, a simplified functional diagram of a plurality of first, second and third banks of base modules 200, 500 and 600, respectively, each forming a backplane as similarly described above, in accordance with an embodiment of the present invention is shown. The first, second and third banks of base modules 200, 500 and 600 each include a series of enclosures arranged from left to ride, side by side. As described above, the first bank 200 comprises a left most double adapter base module 202, followed by a first double terminal I/O base module 204, followed by a second double terminal I/O base module 206, followed by a right most single terminal I/O base module 208 integrating an end cap. The second bank 500 comprises a left most double bus expansion base module 502, followed by a first double terminal I/O base module 504, followed by a second, right most double terminal I/O base module 506 integrating an end cap. The third bank 600 comprises a left most double bus expansion base module 602, followed by a first double terminal I/O base module 604, followed by additional base modules, followed by a double terminal I/O base module 606, followed by a right most end cap enclosure module. The first bank 200 may be held by attachment to a first DIN rail 218, the second bank 500 may be held by attachment to a second DIN rail 510, and the third bank 600 may be held by attachment to a third DIN rail 610. The first base modules of each bank of base modules 200, 500 and 600 also each include power supplies modules 276, 277, 512, 513, 612 and 613, respectively, for coupling the respective module to an external power source and for providing power to the rest of each respective bank via the releasable electrical connectors. The adapter base module 202 may also include, for example, network ring access, locally connected terminal access, manually configurable inputs (such as DIP switches), base logic, one or more bus slots and network adapters and network adapting for PLC access. The bus expansion base modules 502 and 602 may include, for example, network ring access, locally connected terminal access, manually configurable inputs (such as DIP switches), base logic and one or more bus slots and function cards, but need not provide, for example, network adapting for PLC access. Each I/O base module may couple and communicate with respective controlled processes or machines 514.

In the present embodiment, instead of forming a network ring with a single backplane, the first bank 200 may couple to the second bank 500, the second bank 500 may couple to a third bank 600, and the third bank 600 may couple to the first bank 200 to form a larger network ring comprising a plurality of backplanes. As such, the adapter base module 202 may couple the loopback 322 to the first port 518 of the bus expansion base module 502 via an externally attached network cable 516. In turn, the bus expansion base module 502 may provide a backplane 520 with a loopback 522 to the fourth port 524 of the bus expansion base module 502. In turn, the bus expansion base module 502 may couple the loopback 522 to the first port 618 of the bus expansion base module 602 via an externally attached network cable 616. In turn, the bus expansion base module 602 may provide a backplane 620 with a loopback 622 to the fourth port 624 of the bus expansion base module 602. In turn, the bus, expansion base module 602 may couple the loopback 622 to the first port 222 of the adapter base module 202 via an externally attached network cable 626, thus forming a network ring among the backplanes. The first bank 200, via the adapter module 202, may couple the network ring to the first PLC 246 and the second PLC 250 in an alternative daisy-chain topology without requiring network switches.

Figure 8:
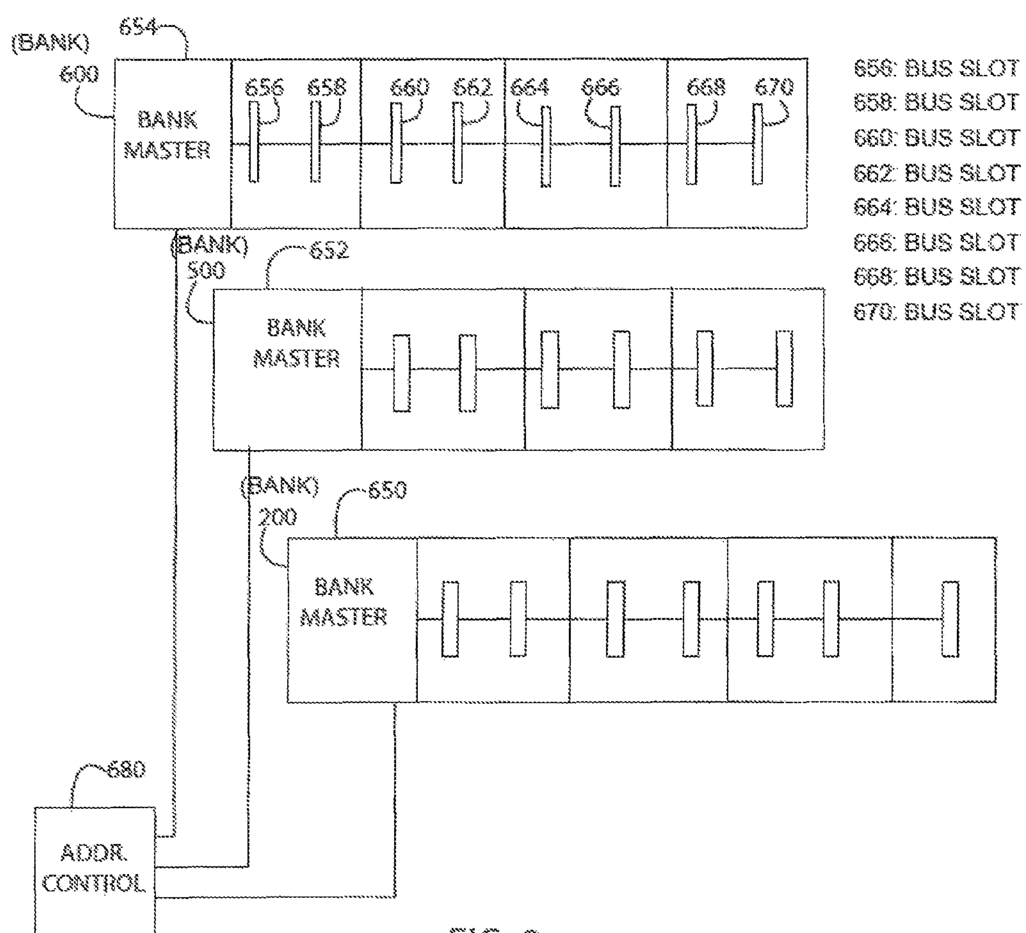
FIG. 8 is a simplified functional diagram of a plurality of banks with unique physical addresses in accordance with an embodiment of the present invention.

Referring now to FIG. 8, a simplified functional diagram of a plurality of banks with unique physical addresses in accordance with an embodiment of the present invention is shown. Each bank may comprise a bank master having a physical address space offset for use within each bank. Each bank master may receive the physical address space offset from address control 680, which may, comprise, for example, a plurality of manually configurable inputs, such as DIP switches. The first bank 200 may have, for example, a bank master 650 having an offset of 00 Hex, the second bank 500 may have a bank master 652 having an offset of 10 Hex and third bank 600 may have a bank master 654 having an offset of 20 Hex.

Figure 9:
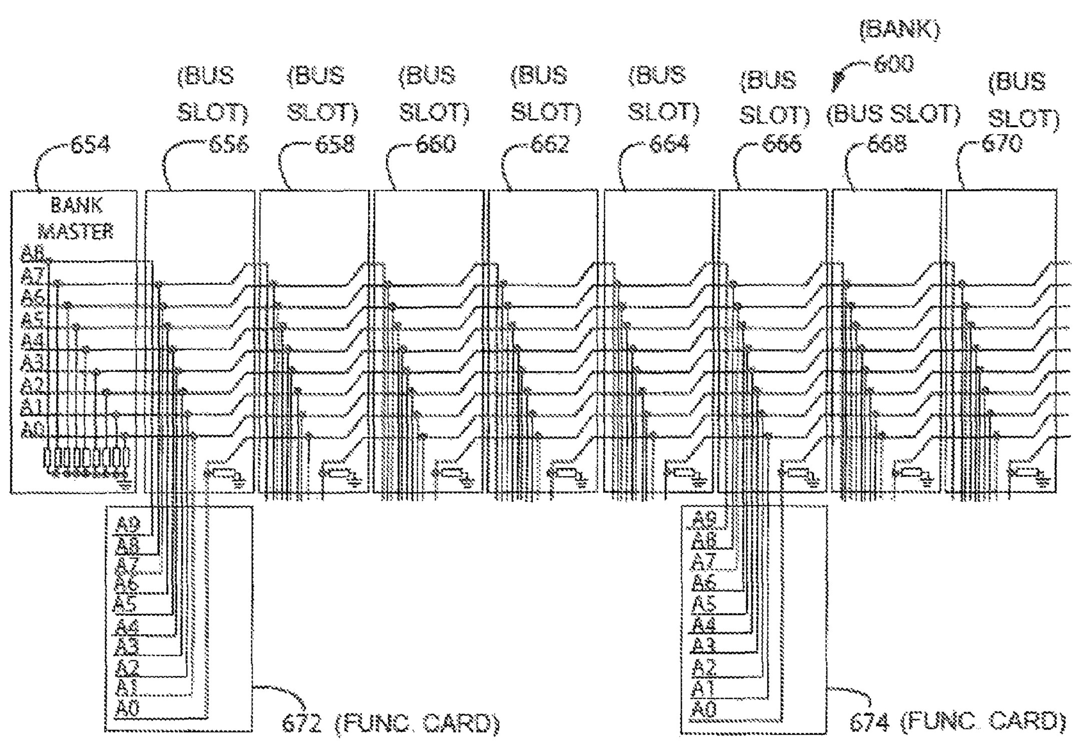
FIG. 9 is a simplified functional diagram of a bank of base modules with address definition lines communicating between each bus slot in accordance with an embodiment of the present invention.

Referring now to FIG. 9, a simplified functional diagram of the bank of base modules 600 with address definition lines communicating between each bus slot in accordance with an embodiment of the present invention is shown. The bank master 654 provides address definition lines A0-A8 to the first bus slot 656. The first bus slot 656, as well as each following bus slot, in turn receives the address definition lines A0-A8, shifts the address definition lines to A1-A9, and provides a ground for address definition line A0. As a result, a unique address pattern is created for nine consecutive bus slots, independent of whether adapter or I/O function cards are installed. In addition, function cards having the same addressing connectivity, such as a first function card 672 installed in a first bus slot 656 and a second function card 674 installed in sixth bus slot 666, may nevertheless be uniquely addressed based on their unique physical locations. In alternative embodiments, additional address definition lines and/or alternative patterns may be used as known in the art.

Using the physical address space offset and the address definition lines, each physical location, or bus slot, in the plurality of banks in the network ring may have a unique physical address, regardless of whether a network adapter or function card is installed. As such, each bus slot may be addressed by the unique physical address, thereby providing an addressing mechanism independent of the unique node addresses used in the ring, which may use, for example, media access control (MAC) addresses. If, for example, an I/O function card fails and is replaced by another I/O function card, though it may have a different MAC address, the industrial system can continue to address the same physical location without change.

Figure 12:
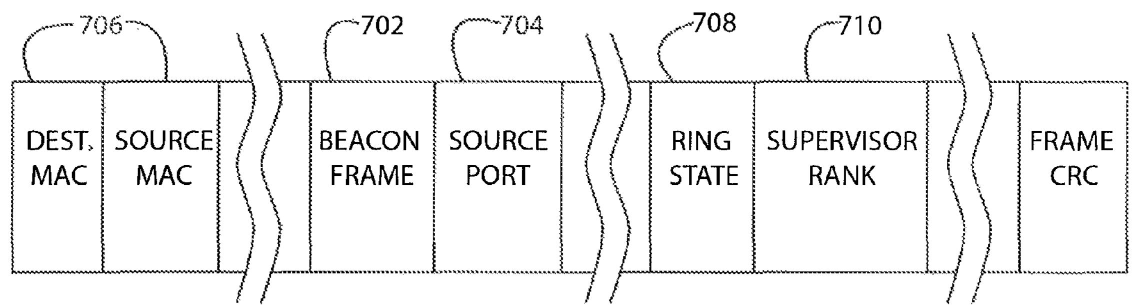
FIG. 12 is a depiction of the fields of the beacon frames communicating ring state and allowing transfer of responsibilities of the supervisory node.

Referring back to FIGS. 4 and 5, during normal operation of the network ring, one switching node, such as switching node 362, will operate as the active supervisory node (also termed an active ring supervisor) and in this capacity will send three types of frames from each of its ports A and B. First, the supervisory node 362 will send beacon frames out of each of its ports. The beacon frames may be transmitted at an extremely high rate, typically one every 400 μs or immediately upon change of ring state event. Referring momentarily to FIG. 12, each beacon frame will include data identifying it as a beacon frame 702, data identifying a source port 704 indicating the port A or B from which it is transmitted, and a source and destination MAC address 706, source being the MAC address of the supervisory node 362 transmitting the beacon frame and a destination that will be apparent by context. The beacon frame also includes ring state data 708 indicating a ring state, indicating whether the ends of the ring are open at the supervisory node 362 meaning that frames are not passed between ports A and B (open mode) or the ends of the ring are closed at the supervisory node 362 allowing frames to pass between ports A and B (closed mode). Finally, the beacon frame holds data 710 indicating the rank of the current supervisory node 362. The supervisory node 362 also transmits conventional Ethernet data frames carrying data for the control of the industrial process or machine. These data frames will be directed to particular nodes through a port A or B determined by an internal routing table constructed according to methods known in the art.

In addition, the supervisory node 362 may transmit ring protocol frames which do not carry control data but serve to indicate the state of the network. The ring protocol frames may include (1) "link status frames" transmitted from the non-supervisory switching nodes ("non-supervisory nodes") to the supervisory node 362 to indicate physical media failure, (2) "locate fault frames" transmitted by the supervisory node 362 to other nodes to determine location of a fault, (3) "neighbor check request frames" and "neighbor check response frames" forming part of the fault location process as will be described; and (4) "neighbor status frames" transmitted from the nonsupervisory nodes to the supervisory node 362 forming part of fault location process. Typically ring protocol frames are transmitted only occasionally upon certain events. All ring protocol frames are encoded with highest priority and are transmitted and processed with highest priority to provide deterministic ring network performance.

As noted above, supervisory node 362 may operate in two distinct modes. In the open mode, data frames received at a given port A (not intended for the supervisory node 362) are not forwarded to, the opposite port B and vice a versa. In the closed mode, data frames received at a given port A (and not intended for supervisory node 362 as a destination) will be forwarded to the port B. Generally, in both modes, beacon frames transmitted from one port A are detected at the other port B, and vice a versa, but not forwarded.

Referring still back to FIGS. 4 and 5, the beacon frames and the data frames may be dealt with differently at each of the non-supervisory nodes, such as 382. As an example, in non-supervisory node 382, each of the beacon frames will generally be passed from port A to port B or vice versa. In transferring the beacon frames, non-supervisory nodes will generally extract only, a ring state data 708 shown in FIG. 12 from the beacon frames which are passed. This ring state data 708 indicates whether the ring network is operating with the open or closed mode topology as described above. In addition, the non-supervisory nodes will monitor non-reception of beacon frames on both ports in open mode and reception of beacon frames on both ports in closed.

Figure 10:
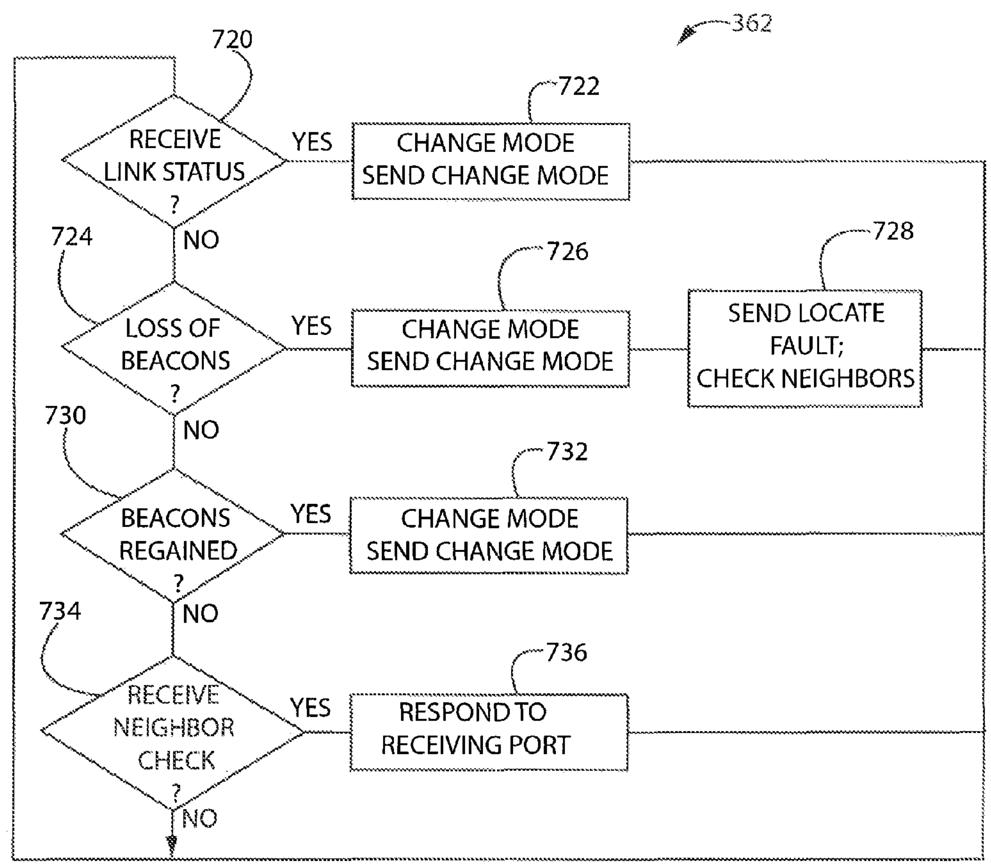
FIG. 10 is a flow chart of the operation of the active supervisory node.

Referring now to FIG. 10, an active supervisory node 362 may execute a stored program to monitor link status frames from any of the non-supervisory nodes and to detect a link failure on one of its own ports. This monitoring is shown by decision block 720. These link status frames generally indicate a physical layer failure detected by a ring node using IEEE 802.3 fault detection techniques (for example detecting a loss of voltage at a port A or B by the switching node transmitting the link status frame).

Upon receipt of a link status frame indicating such a failure or upon detecting a link failure on one of its ports, the active supervisory node 362 will move to a closed mode connecting its ports A and B to allow conventional data frames to pass there through thus restoring continuity of transmission to the nodes around a break at point caused by a failure of physical media or the like. The active supervisory node 362 immediately transmits a mode change to the other nodes as indicated by process block 722 through both of its ports A and B. This mode change is transmitted immediately in the beacon frames as ring state data 708 as shown in FIG. 12.

Absent a receipt of a link status signal indicating a break at a local node or loss of link on its own port, the active supervisory node 362 may also detect a loss of beacons on one or the other of its ports A and B as indicated by decision block 724. This detection occurs when either port A fails to receive beacon frames transmitted from port B or vice a versa within a predefined beacon timeout period. Such a beacon loss may detect failures undetectable by the other switching nodes, for example high-level failures that leave the physical layer functioning. An example of such a failure would be an internal embedded switch failure of network node. Upon such a detection of a loss of beacons, as indicated by the process block 726, again the ports A and B are connected with each other and mode change data is forwarded to the other nodes (in beacon frames) in a manner analogous to process block 722. Then, at process block 728, the supervisory node 362 sends a locate fault frame to the nonsupervisory nodes to help identify the location of the fault and starts verification of its own neighbors on both of its ports.

At a later time, as indicated by process block 730, the active supervisory node 362 may detect a restoration of the beacon frames at both of its ports A and B, that is, beacon frames received at port A from port B and vice a versa. If so, the active supervisory node 362 separates ports A and B with respect to traffic and immediately sends a mode change signal at process block 732 indicating that the open mode has been restored. The mode change data is transmitted immediately in beacon frames.

Figure 11:
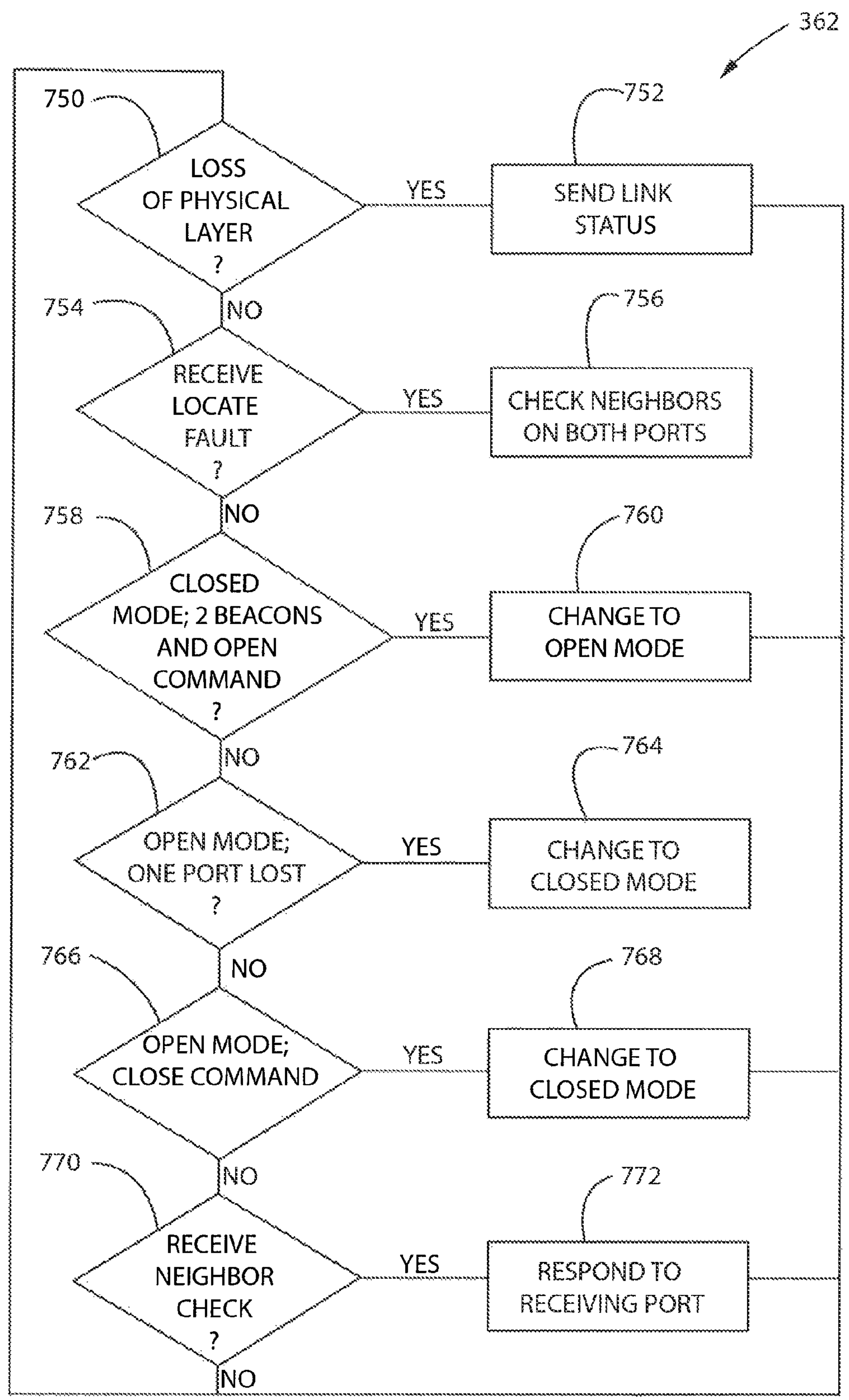
FIG. 11 is a flow chart of the operation of the beacon frame processing network nodes not operating as supervisory nodes.

Referring now to FIG. 11, each node, other than the active supervisory node 362, similarly executes software supporting their roles in the above process. Thus, for example, each of these nodes monitor their physical connections as indicated by decision block 750 to check for loss of a physical link. Such physical link failures will be detected only by the nodes adjacent to the failure and can result from hardware network interface failures or cut media or intentionally disconnected media, for example when new nodes are being connected. When such a loss is detected, the nodes send a link status frame indicating the failure to the supervisory node 362 as indicated by process block 752. This allows active supervisory node 362 to pinpoint failure location as a diagnostic aid to user.

The nodes also monitor the ring protocol frames for a locate fault frame from the active supervisory node 362 as, indicated by decision block 754 sent by the supervisory node 362 as indicated by process block 728 described above. When such a locate faults signal is received, at process block 756, the nodes send messages to a neighboring node on both ports.

As indicated by decision block 770, each neighbor node receiving such a neighbor check request frame as detected at decision block 770 responds with neighbor check response frame on the receiving port as indicated by process block 772 indicating that they have received the message. When a neighbor fails to respond, the requesting node sends a neighbor status frame to active supervisory node. This allows active supervisory node to pinpoint failure location as a diagnostic aid, to user.

A locate fault frame may be sent at any time by the supervisory node 362 to update stale information. Non-supervisory nodes will always pass frames between both ports irrespective of current ring state mode.

When the ring is in the closed mode, the beacon frame processing nodes monitor reception of beacons on both ports. Upon reception of beacon frames on both ports as detected at decision block 758 and reception of at least one beacon frame on either port indicating a mode change to open mode ring state, they will change mode to open mode as indicated by process block 760.

Alternatively, when in open mode, as indicated by process block 762, the non-supervisory nodes monitor reception of beacons on both ports. Upon non-reception of a beacon frame on either port with predetermined beacon timeout period, they will change mode to closed mode per process block 764. Alternatively, upon reception of at least one beacon with ring state closed mode in either port, detected per process block 766, they will change mode to closed mode per process block 768.

All nodes including active supervisory node 362 will flush their unicast and multicast MAC address routing tables for two ring ports immediately upon ring state mode changes and relearn routing tables so that data frames are forwarded through correct ports as known in the art.

The present invention contemplates that there may be backup ring supervisors to active ring supervisory node 362. At the initialization of the ring network, each such potential ring supervisor is given a unique number in the sequence. The current supervisor number is transmitted as a supervisor rank 710 in the beacon frame. In a situation when new supervisory nodes start operation or during initialization of the ring network, multiple potential supervisors may all send beacon frames containing their supervisor rank 710. The vying supervisors monitor the beacon frames and withdraw when they detect beacon frames from other supervisor having a dominant supervisor rank 710 (higher or lower by predetermined convention). When two supervisor numbers are equal, dominant supervisor is selected by the numerically higher (or lower by predetermined convention) MAC address of the supervisor. The beacon frame processing non-supervisory nodes use the same algorithm to track active supervisor.

When beacon frames from an active ring supervisory node 362 are not detected by a backup ring supervisor node for a predetermined period of time, all potential supervisory nodes will switch to closed mode for a predetermined quiet period. At the end of this quiet period, the backup ring supervisors will send their own beacon frames as described above and the new ring supervisor will be selected.

During start up, the active supervisory node 362 will start in closed mode (passing frames between its ports) and will switch to open mode when it receives its own beacon frames on both of its, ports. Each beacon frame processing node, will start in the closed mode and will switch to the open mode only when they receive beacon frames from active supervisory node on both of their ports and with open mode in ring state of beacon frame on at least one port. Non-supervisory nodes including back up supervisory nodes always pass frames between their ports irrespective of current ring state mode of operation.

The present invention can detect and respond to several unusual situations. For example, each protocol-aware node may monitor the arrival of its own frames back to its other port. This indicates an incorrect network loop when an active supervisory node is not present and the nodes may respond by notifying the user of an error. It is possible for the ring supervisory node 362 to repeatedly respond to an intermittent or loose connector (a media fault) by cycling between closed mode and open mode. The ring supervisory node 362 may track the number of faults within a predetermined time interval and when the number of faults exceeds a predetermined threshold, it may block traffic forwarding, stop cycling between modes and provide a warning to the user of this situation.

It is possible for high-level faults to occur such that frames are lost in only one direction. When this situation is detected, the active ring supervisory node 362 may block traffic forwarding in one direction and notify the user of a fault condition.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor" can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. A backplane for an industrial control system comprising: an adapter base module having a first port, a second port, a switching node and a network adapter, the switching node coupled between the first port and the second port and in communication with the network adapter, the network adapter operable to communicate over a control network; a plurality of I/O base modules, each I/O base module having a first port, a second port and a bus slot, the bus slot for releasably receiving a function card having a switching node, wherein each I/O base module couples the first port and the second port to the switching node when the function card is installed in the bus slot, and each I/O base module couples the first port to the second port when the function card is absent from the bus slot; and at least one I/O base module having a function card installed in the bus slot; wherein the second port of the adapter base module is coupled to the first port of an I/O base module, and the second port of each I/O base module is coupled to the first port of the next I/O base module, except the last I/O base module, and the adapter base module and the plurality of I/O base modules each have a third port and a fourth port that are coupled together, wherein the second port of the last I/O base module is coupled to the third port of the last I/O base module, and the fourth port of each I/O base module is coupled to the third port of the previous I/O base module, except the first I/O base module having the fourth port coupled to the third port of the adapter base module, the fourth port of the adapter base module coupled to the first port of the adapter base module to form the network ring.

2. The backplane of claim 1, wherein each switching node contains a unique node address in the ring, and each bus slot is assigned a unique physical address independent of the unique node address.

3. The backplane of claim 2, wherein the unique node address is determined by MAC address.

4. The backplane of claim 2, wherein the unique physical address is determined by address definition lines communicating between each bus slot.

5. The backplane of claim 1, wherein each I/O base module further comprises a plurality of terminals for releasbly receiving electrical conductors communicating with a controlled process or machine.

6. The backplane of claim 1, wherein the second port and the third port are part of a first electrical connector and the first port and the fourth port are part of a second electrical connector.

7. the backplane of claim1, wherein the second port of the last I/O base module is coupled to the third port of the last I/O base module via an externally attached end cap enclosure.

8. the backplane of claim 1, wherein the fourth port of the adapter base module is coupled to the first port of the adapter base module via an externally attached network cable.

9. The backplane of claim 1, wherein at least one of the switching nodes is an active ring supervisor adapted to operate to:

(a) transmit beacon frames out of each port at a first rate and monitor the other port for reception of beacon frames, wherein the beacon frames indicate a state of operation of the ring network as a closed mode or an open mode;

(b) respond to a receipt of beacon frames between the first and second ports by blocking data frames between the first and second ports in an open mode;

(c) respond to failure of the beacon frames to traverse the ring by changing to a closed mode passing data frames between the first and second ports; and wherein switching nodes that are not the active ring supervisor are adapted to operate to:

(a) pass beacon frames between the first and second ports;

(b) respond to a change in the state of operation of the ring network deduced from either (i) non-receipt of beacon frames on either port or;(ii) receipt of beacon frames indicating a change in operating between closed mode or open mode to reset their MAC address routing tables.

10. The backplane of claim 1, further comprising an I/O base module having a second bus slot, the second bus slot for releasably receiving a second function card having a switching node, wherein the I/O base:

(a) couples the first port and the second port to the switching node of the first function card when the first function card is installed in the first bus slot and the second function card is absent from the second bus slot;

(b) couples the first port and the second port to the switching node of the second function card when the second function card is installed in the second bus slot and the first function card is absent from the first bus slot;

(c) couples the first port to the switching node of the first function card, couples the switching node of the first function card to the switching node of the second function card, and couples the second port to the switching node of the second function card when the first function card is installed in the first bus slot and the second function card is installed in the second bus slot; and (d) couples the first port to the second port when both function cards are absent from the bus slots.

11. A backplane for an industrial control system comprising: an adapter base module having a first port, a second port, a switching node and a network adapter, the switching node coupled between the first port and the second port and in communication with the network adapter, the network adapter operable to communicate over a control network; a plurality of I/O base modules, each I/O base module having a first port, a second port and a bus slot, the bus slot for releasably receiving a function card having a switching node, wherein each I/O base module couples the first port and the second port to the switching node when the function card is installed in the bus slot, and each I/O base module couples the first port to the second port when the function card is absent from the bus slot; and at least one I/O base module having a function card installed in the bus slot; wherein the second port of the adapter base module is coupled to the first port of an I/O base module, and the second port of each I/O base module is coupled to the first port of the next I/O base module, except the last I/O base module having the second port coupled to the first port of the adapter base module to form a network ring of switching nodes, and wherein the adapter base module further comprises a first bus slot for releasably receiving a first function card containing a switching node in communication with the network adapter, and a second bus slot for releasably receiving a second function card containing a switching node in communication with a second network adapter, wherein the adapter base: (a) couples the first port and the second port to the switching node of the first function card when the first function card is installed in the first bus slot and the second function card is absent from the second bus slot; (b) couples the first port and the second port to the switching node of the second function card when the second function card is installed in the second bus slot and the first function card is absent from the first bus slot; and (c) couples the first port to the switching node of the first function card, couples the switching node of the first function card to the switching node of the second function card, and couples the second port to the switching node of the second function card when the first function card is installed in the first bus slot and the second function card is installed in the second bus slot.

* * * * *